United States Patent [19]

Hathaway et al.

[11] 4,392,930
[45] Jul. 12, 1983

[54] PHOTOPOLYMERIZABLE RESINS

[75] Inventors: Roderick D. Hathaway, Cambridge; Edward Irving, Burwell; John S. Waterhouse, Cherry Hinton, all of England

[73] Assignee: Ciba-Geigy Corporation, Ardsley, N.Y.

[21] Appl. No.: 393,894

[22] Filed: Jun. 30, 1982

[30] Foreign Application Priority Data

Jul. 9, 1981 [GB] United Kingdom ............... 8121172
Apr. 3, 1982 [GB] United Kingdom ............... 8209955

[51] Int. Cl.$^3$ ............................. C08F 8/00; C08F 2/46
[52] U.S. Cl. ........................ 204/159.14; 204/159.22; 427/44; 528/96; 528/117; 528/367
[58] Field of Search ..................... 204/159.14, 159.22; 528/96, 117, 367

[56] References Cited

U.S. PATENT DOCUMENTS

| | | | |
|---|---|---|---|
| 4,012,565 | 3/1977 | Freedman et al. | 204/159.14 X |
| 4,084,020 | 4/1978 | Mathias et al. | 204/159.14 X |
| 4,150,166 | 4/1979 | Mathias et al. | 204/159.14 X |
| 4,150,167 | 4/1979 | Mathias | 204/159.14 X |
| 4,167,465 | 9/1979 | Zussman et al. | 204/159.22 X |
| 4,306,954 | 12/1981 | Wendling et al. | 204/159.22 X |

Primary Examiner—Lucille M. Phynes

Attorney, Agent, or Firm—Luther A. R. Hall

[57] ABSTRACT

Diacrylates or dimethacrylates, which are compatible with water before exposure to actinic radiation but after such exposure form hard, insoluble, coatings which are resistant to organic solvents and to water, are made by reaction with (meth)acrylic acid, or with a dicarboxylic acid and a hydroxy group-containing (meth)acrylate, of epoxide groups in an advanced diepoxide resin containing groups of formula

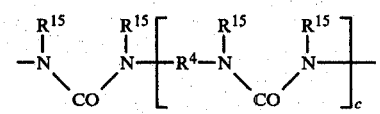

where
$R^4$ denotes a divalent (cyclo)aliphatic or araliphatic radical,
each $R^{15}$ denotes an alkyl group or each pair of $R^{15}$ denotes a group of formula $-(CH_2)_2-$, $-C(R^{16}R^{17})CO-$, $-CH_2CH(CH_3)-$, $-(CH_2)_3-$, or $-(CO)_2-$, wherein $R^{16}$ and $R^{17}$ each represent a hydrogen atom, an alkyl group, or, conjointly, a cycloaliphatic ring, and
c is zero or 1.

9 Claims, No Drawings

PHOTOPOLYMERIZABLE RESINS

BACKGROUND OF THE INVENTION

This invention relates to resins which polymerise on exposure to actinic radiation, to methods of preparing them and of polymerising such resins in water-borne form by means of actinic radiation, to supports bearing thereon such a resin in the polymerisable state, and to substrates bearing thereon a resin polymerised by means of actinic radiation.

Substances capable of becoming polymerised on exposure to actinic radiation are used as surface coatings, e.g., on metals, paper, and card (i.e., boxboard, about 0.1 to 0.5 mm thick, used in the construction of folding cartons). The advantage of using actinic radiation is that the consumption of energy is generally less than when the substances have to be polymerised by the action of heat. Substances commonly employed are the adduct of acrylic acid or methacrylic acid with the diglycidyl ether of bisphenol A, i.e., 2,2-bis(4-(3-acryloyloxy-2-hydroxypropoxy)phenyl)propane or its methacryloyl homologue. However, the viscosity of compositions containing these adducts is generally too high for ease of application, and so low molecular weight photopolymerisable acrylates, such as propylene glycol diacrylate and glycerol triacrylate, are incorporated.

However, the use of volatile, low molecular weight acrylate esters in such compositions is often undesirable, on grounds of toxicity, and so the need exists for resins which may be polymerised by means of actinic radiation and which may be used as surface coatings but do not contain acrylate esters of low molecular weight.

It has now been found that, by using certain novel advanced resins, the aforesaid requirement can be at least substantially met.

In our British Patent Specification No. 1 521 933 we have described resins which are soluble in water before exposure to actinic radiation but which, on exposure to actinic radiation, polymerise and become insoluble in water, the said resins having the formula

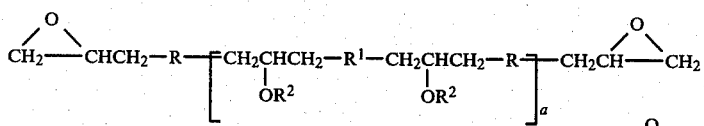
I where
a is an integer of average value of at least 1, but preferably not more than 100,
each R and R¹ represents a group of formula

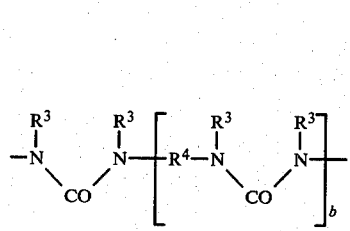
II or $-O-(OC)_c-R^5-(CO)_c-O-$, each $R^2$ represents a hydrogen atom or a group of formula $-(CH_2NH)_aCOC(R^6)=CH_2$, with the proviso that at least 1, and preferably at least 25%, of the 2a groups $R^2$ are other than a hydrogen atom, each $R^3$ denotes an alkyl group of 1 to 4 carbon atoms, or conjointly each pair represents a group of formula $-CH_2CH_2-$, $-C(R^7R^8)CO-$, $$-CH_2CH-,\atop\phantom{-}CH_3$$

$-CH_2CH_2CH_2-$, $-COCO-$, $-COCOCO-$, or $-COC(OH)_2CO-$, $R^4$ represents a divalent aliphatic, cycloaliphatic, or araliphatic radical of 1 to 8 carbon atoms, especially an alkylene group of 1 to 6 carbon atoms, b, c, and d are each zero or 1, $R^5$ represents a straight or branched chain aliphatic group of 2 to 20 atoms, such as one of 2 to 9 carbon atoms, especially an alkylene group which may be interrupted by one or more carbonyloxy groups or by one or more ether oxygen atoms, or, providing each c is 1, it may alternatively represent a group of formula

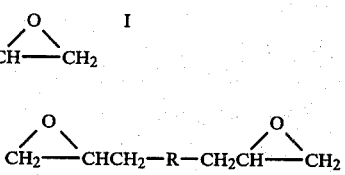
III $R^6$ represents a hydrogen atom or an alkyl group of 1 to 4 carbon atoms, and $R^7$ and $R^8$ each represent a hydrogen atom or a methyl or ethyl group.

The resins of formula I were prepared in two stages. The first involved reaction of a diepoxide of formula IV

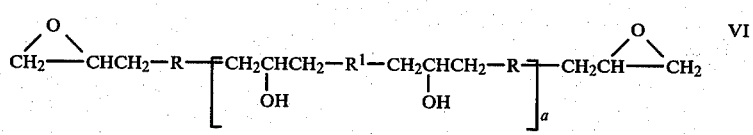
IV with a diol, dicarboxylic acid, or heterocycle of formula V

V to form an advanced, linear diepoxide of formula VI

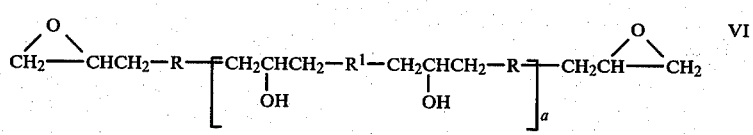
VI

In the second stage, some or all of the indicated secondary hydroxyl groups were replaced by groups of formula $-O-(CH_2NH)_aCOC(R^6)=CH_2$ through reaction with e.g., N-(hydroxymethyl)acrylamide or acryloyl chloride.

In British Patent Specification No. 1 367 207 we have described polyacrylates of N-heterocyclic compounds. One of the Examples describes a process in which 1-glycidyl-3-(2-glycidyloxy-n-propyl)-5,5-dimethyl-hydantoin (0.9 equiv.) is heated with sebacic acid (0.6 equiv.) to form a product having principally the structure

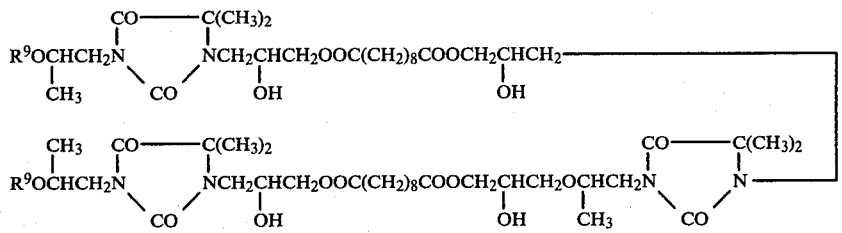

where each $R^9$ denotes a glycidyl group.

This diepoxide is then heated with acrylic acid (0.3 equiv.) to form a resin, highly viscous in the cold, to which is ascribed the principal structure VII where each $R^9$ now denotes a 3-acryloyloxy-2-hydroxypropyl group.

In British Patent No. 1 399 135 we have described the polymerisation of such polyacrylates as that of formula VII where each $R^9$ denotes a 3-acryloyloxy-2-hydroxypropyl group by means of ionising radiation.

We have now found that novel acryloyl or methacryloyl-containing resins may be prepared and substantially meet the aforesaid requirements. While not necessarily fully soluble in water they are miscible with it, and can be applied containing limited amounts (e.g., from 5 to 25% by weight) of water for ease of application.

SUMMARY OF THE INVENTION

One aspect of this invention accordingly provides resins which, on exposure to actinic radiation, polymerise and form hard, nontacky, chemically-resistant coatings, the said resins having the formula

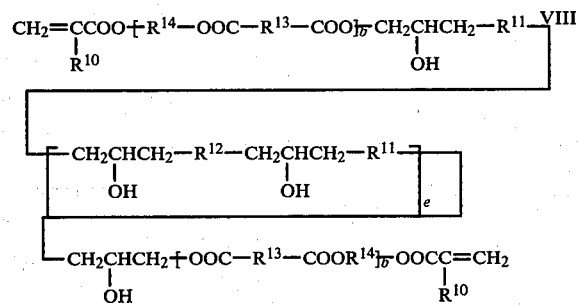

where
b represents zero or 1,
e is an integer of average value at least 1,
each $R^{10}$ denotes a hydrogen atom or a methyl group,
each $R^{11}$ represents the organic divalent residue of a compound having two glycidyl groups directly attached to an atom or atoms of oxygen, nitrogen, or sulphur, after removal of the said two glycidyl groups,
each $R^{12}$ represents the divalent residue of a dihydric alcohol, a dihydric phenol, a saturated dicarboxylic acid of 2 to 8 carbon atoms, or a compound containing two groups selected from amide groups and imide groups, after removal of two terminal hydrogen atoms attached to an atom or atoms of oxygen or nitrogen,
each $R^{13}$ denotes an alkylene group of 1 to 6 carbon atoms, an alkenylene group of 2 to 10 carbon atoms, an arylene group of 6 to 10 carbon atoms, or a cycloalkylene or cycloalkenylene group of 5 to 8 carbon atoms,
each $R^{14}$ denotes a divalent aliphatic, cycloaliphatic, or araliphatic group of 2 to 8 carbon atoms,
with the proviso that at least 25% of the total of the $(e+1)$ $R^{11}$ and e $R^{12}$ groups each represent a group of formula

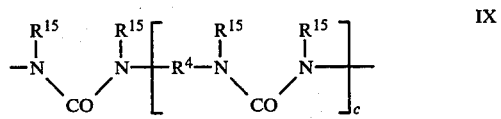

where
$R^4$ has the meaning previously assigned,
c denotes zero or 1, and
each $R^{15}$ denotes an alkyl group of 1 to 4 carbon atoms, or conjointly each pair of $R^{15}$ represents a group of formula $-CH_2CH_2-$, $-C(R^{16}R^{17})CO-$,

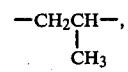

$-CH_2CH_2CH_2-$, or $-COCO-$, wherein $R^{16}$ and $R^{17}$ each denote a hydrogen atom or a straight or branched alkyl group of up to 9 carbon atoms or $R^{16}$ and $R^{17}$ may together denote a tetramethylene, pentamethylene, methylpentamethylene, or hexamethylene group.

DETAILED DISCLOSURE

The preferred resins of formula VIII are those wherein e represents an integer of average value at most 10, especially from 1.2 to 5.

Preferably at most 75% of the total of the $(e+1)$ $R^{11}$ and e $R^{12}$ groups represent a group of formula IX. It is believed that the compatibility with water of the compounds of formula VIII is attributable to the presence of groups of formula IX; however, if too high a proportion of the $R^{11}$ and $R^{12}$ groups is so constituted the photopolymerised product may have insufficient resistance to water for some purposes. It is therefore desirable that at least 25% of the total of the groups $R^{11}$ and $R^{12}$, where they do not represent a group of formula IX, denote an oxyalkyleneoxy group of 2 to 40 carbon atoms (which may be interrupted in the chain by one or more ether oxygen atoms) or an oxyaryleneoxy group of 6 to 18 carbon atoms. Further preferred are the compounds of formula VIII wherein $R^{11}$ and $R^{12}$, where they do not represent a group of formula IX, each denote an oxyalkyleneoxy group, the alkylene component of which is a chain of 3 to 6 consecutive carbon atoms or a chain of 4 to 28 carbon atoms interrupted by one or more ether oxygen atoms, an oxyphenyleneoxy group, or a group of formula

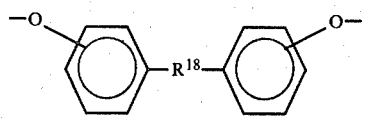

where $R^{18}$ represents a carbon-carbon bond, an ether oxygen atom, a carbonyl group, a sulphonyl group, a methylene group, or an isopropylidene group.

When b represents 1, $R^{13}$ and $R^{14}$ both preferably represent alkylene groups of 2 to 6 carbon atoms.

Particularly preferred are resins containing groups of formula IX where each pair of $R^{15}$ denotes a group of formula $-C(R^{16}R^{17})CO-$, wherein $R^{16}$ is a methyl, ethyl, n-propyl, n-pentyl, neopentyl, sec. amyl, or 2-ethylhexyl group and $R^{17}$ is a methyl group, or $R^{16}$ and $R^{17}$ together denote pentamethylene or hexamethylene.

Specific examples of groups suitable as $R^{11}$ and $R^{12}$, when they are further of formula IX, are

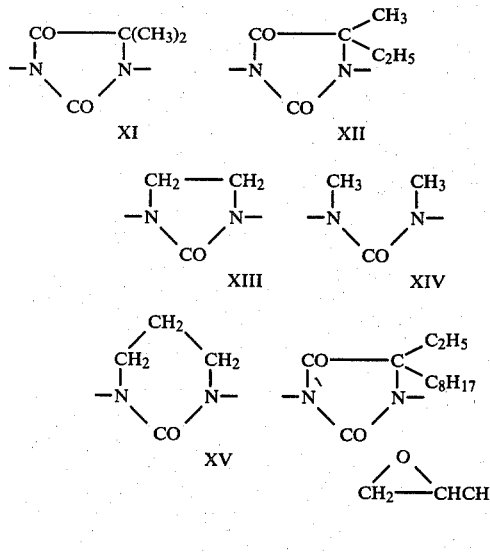

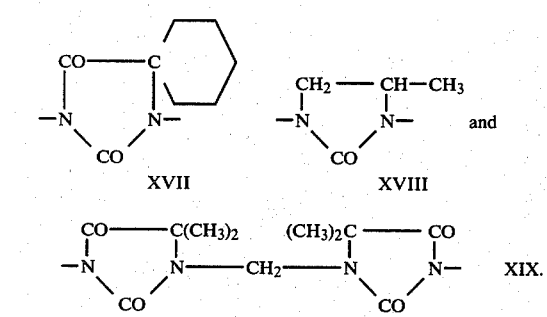

The groups of formulae XI to XIX are respectively the residue of 5,5-dimethylhydantoin, 5-ethyl-5-methylhydantoin, imidazolidin-2-one, 1,3-dimethylurea, hexahydro-2H-pyrimidin-2-one, 5-methyl-5-(2-ethylhexyl)-hydantoin, 5,5-pentamethylenehydantoin, 4-methylimidazolidin-2-one, and 1,1'-methylenebis(5,5-dimethylhydantoin).

Specific examples of suitable groups $R^{11}$ and $R^{12}$, when they are not further of formula IX, are those of formula

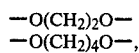

XX
XXI

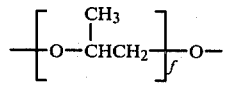

XXII where f is an integer of average value 7.3, and

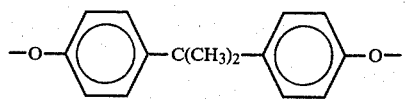

XXIII

The groups of formulae XX to XXIII are, respectively, the residues of ethylene glycol, butane-1,4-diol, a poly(oxypropylene) glycol of average molecular weight 425, and 2,2-bis(4-hydroxyphenyl)propane.

Resins of formula VIII in which b represents zero may be prepared in two stages.

The first involves reaction of a diepoxide of formula

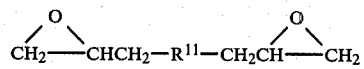

XXIV with a dihydric alcohol, a dihydric phenol, a dicarboxylic acid, or an amide or amide-imide of formula

    XXV to form an advanced, linear diepoxide of formula

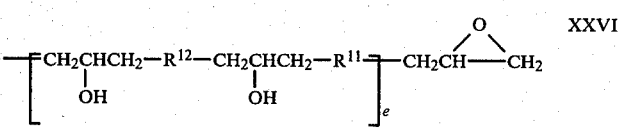

XXVI where e, $R^{11}$, and $R^{12}$ are as hereinbefore defined.

Usually, the diepoxide of formula XXIV is heated with the compound of formula XXV at a temperature within the range 120°-210° C., and especially at 140°-190° C. The reaction can be accelerated by adding suitable catalysts. Such catalysts are, for example, alkali metal hydroxides such as sodium hydroxide; alkali metal halides such as lithium chloride, potassium chloride, and sodium chloride, bromide, or fluoride; tertiary amines such as triethylamine, tri-n-propylamine, N-benzyldimethylamine, N,N'-dimethylaniline, and triethanolamine; quaternary ammonium bases such as benzyltrimethylammonium hydroxide; quaternary ammonium salts such as tetramethylammonium chloride, tetraethylammonium chloride, benzyltrimethylammonium chloride, benzyltrimethylammonium acetate, and methyltriethylammonium chloride; and hydrazines having a tertiary nitrogen atom, such as 1,1-dimethylhydrazine, which can also be employed in their quaternised form. Depending on the choice of starting substances, the reaction in some cases takes place quantitatively so rapidly that no addition of catalyst is necessary. Whilst the starting materials are generally mixed with one another at room temperature and are then brought to the reaction temperature, it is advantageous in the case of very interreactive components if the diepoxide of formula XXIV is first heated by itself to the requisite reaction temperature and the other reaction components are then gradually added in small proportions. Progress of the reaction up to formation of an end product having a defined epoxide group content which remains essentially constant can be followed by titration of the epoxide groups using samples taken during the reaction.

Such advancement reactions are known (see, e.g., the British Patent Specification No. 1 521 933 mentioned above).

In the second stage, the water-dilutable resin of formula VIII is prepared from the advanced diepoxide of formula XXVI through opening of the terminal epoxide groups by reaction with acrylic acid or methacrylic acid.

This reaction is generally brought about at a temperature of from 60° to 150° C., especially at 100° to 130° C., in the absence of a solvent or in the presence of an inert, polar solvent such as chloroform. The molar ratio of the advanced diepoxide of formula XXVI to acrylic acid or methacrylic acid is preferably such that substantially all of the indicated glycidyl groups are converted into (meth)acryloyl-2-hydroxypropyl groups.

Advantageously a catalyst for the ring-opening reaction is present. This catalyst may be sodium acetate, or preferably a tertiary amine such as those listed above, a quaternary ammonium salt such as those listed above, or a salt of trivalent chromium with an alkanoic acid, such as octanoic acid and 2-ethylhexanoic acid, or with an alkenoic acid such as acrylic acid.

If desired, an inhibitor of free radicals, such as hydroquinone or 2,6-di-tert.butyl-4-methylphenol, may be included in order to lessen the occurrence of side reactions. Such inhibitors need not be removed at the end of the reaction since they maintain the stability of the product but do not prevent its polymerisation on exposure to actinic radiation.

Resins of formula VIII in which b represents 1 may be prepared from advanced, linear diepoxides of formula XXVI by opening of the terminal epoxide groups on reaction with a dicarboxylic acid of formula

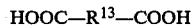 HOOC—R$^{13}$—COOH  XXVII where R$^{13}$ has the meaning previously assigned, or with an anhydride or an acid of formula XXVII, followed by esterification of the thus formed terminal carboxylic acid groups with a hydroxy group-containing ester of acrylic or methacrylic acid, of formula

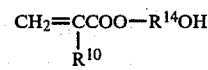 $$CH_2=C(R^{10})COO-R^{14}OH$$  XXVIII where R$^{10}$ and R$^{14}$ have the meanings previously assigned.

Ring opening of the epoxide groups is generally effected under the same conditions as those described above for ring-opening of the diepoxides of formula XXVI with acrylic or methacrylic acid, i.e., a temperature of 60°–150° C. in the presence of a catalyst and optionally an inhibitor of free radicals.

Esterification using a hydroxy ester of formula XXVIII is effected under conventional conditions, particularly by heating at 60° to 150° C., especially at 100° to 130° C., in the absence of a solvent or in an inert, preferably water-immiscible, solvent, and optionally in the presence of a dehydrating agent. If desired, these two steps may be carried out as a single reaction, by combining all the reactants in a single vessel and heating to the desired temperature.

This invention accordingly further provides a method for the preparation of photopolymerisable resins of formula VIII where b denotes zero comprising reaction of the indicated epoxide groups in an advanced diepoxide of formula XXVI with acrylic acid or methacrylic acid, and a method for the preparation of photopolymerisable resins of formula VIII where b denotes 1 comprising reaction of a said advanced diepoxide with a dicarboxylic acid of formula XXVII, or its anhydride, together with a hydroxyalkyl ester of formula XXVIII.

A layer of the resin may be applied to a support by coating the support with a resin in water-borne form, the layer being applied by, for example, dipping, whirling (or spin-coating, i.e., a process in which the material is put on a support which is then rotated at high speed to distribute the material over it), spraying, or by means of a roller.

This invention also includes a support, which may be of, for example, aluminium, steel or other metal, paper, or card, carrying a layer of a resin of formula VIII, also a substrate bearing upon its surface such a resin which has been polymerised by exposure to actinic radiation. It also provides a method of polymerising such a resin which comprises subjecting a layer of the resin on a support to actinic radiation.

In polymerising the resins of this invention actinic radiation of wavelength 200 to 600 nm is preferably used.

Preferably the resin is exposed to actinic radiation in the presence of a photosensitiser such as quinone; a diphenylcarbinol; 5-nitroacenaphthene; a 2-substituted thioxanthone; a diphenylmethane; an α-haloacetophenone such as p-tert.butylphenyl trichloromethyl ketone; a photoredox catalyst such as a mixture of a phenothiazine dye (e.g., methylene blue) or a substituted quinoxaline with an electron-donating reducing agent such as a sulphinic acid or salt of a sulphinic acid, a phosphine, an arsine, or thiourea; a benzophenone; a benzil dialkyl ketal such as benzil dimethyl ketal (i.e., α-methoxybenzoin methyl ether); benzoin; a benzoin alkyl ether; and an O-alkoxycarbonyl derivative of an oxime of benzil or 1-phenylpropane-1,2-dione, such as benzil (O-ethoxycarbonyl)-α-monoxime and 1-phenylpropane-1,2-dione 2-(O-ethoxycarbonyl)oxime. Preferred sensitisers are Michler's ketone (i.e., 4,4′-bis(dimethylamino)benzophenone), benzoin n-butyl ether and mixtures of these two; metal salts of 2-(m- or p-methoxyphenyl)quinoxaline -6′- or -7′- sulphonic acids mixed with a metal salt of toluene-p-sulphinic acid; 1-phenylpropane-1,2-dione 2-(O-ethoxycarbonyl)oxime, benzil dimethyl ketal and mixtures of these two; and 2-chlorothioxanthone and its mixtures with benzil dimethyl ketal. Usually from 0.1 to 20%, and preferably from 0.5 to 15%, by weight of sensitiser, calculated on the weight of the photopolymerisable resin is employed.

The resin should be applied to the support so that its thickness is from about 1 to 250 μm. Unless excessive amounts of water are present in the coating it is not necessary to dry it; residual water in the film does not in general interfere with photopolymerisation, particularly if the substrate is relatively absorbent to water, e.g., card.

Suitable sources of actinic radiation include carbon arcs, mercury vapour arcs, fluorescent lamps with phosphors emitting ultra-violet light, argon and xenon glow lamps, tungsten lamps, and photographic flood lamps. Of these, mercury vapour arcs, particularly sun lamps, fluorescent sun lamps, and metal halide lamps are most suitable. The time required for exposure of a resin will depend upon a variety of factors which include, for example, the individual resin being utilised, thickness of the coating, the type of light source, and its distance from the coating, but may readily be determined by routine experimentation.

The following Examples illustrate the invention. Epoxide contents were determined by titration against a 0.1 N solution of perchloric acid in glacial acetic acid in the presence of excess of tetraethylammonium bromide, crystal violet being used as indicator. All parts and percentages are by weight.

EXAMPLE 1

A mixture of N,N'-diglycidyl-5,5-dimethylhydantoin (epoxide content 7.88 equiv./kg, 50 g) and 1,4-butanediol (12 g), to which had been added chromium III trisoctanoate (0.075 g) as catalyst for the subsequent reaction with acrylic acid, was stirred at 190° C. for 5 hours, by which time the epoxide content of the mixture had fallen to 2.35 equiv./kg. Acrylic acid (10.2 g) and 2,6-di-t-butyl-4-methylphenol (0.14 g) were added to the advanced resin at 100° C. The resulting mixture was stirred at 100° to 105° C. for 6 hours, by which time its epoxide content had fallen to a negligibly low value. Water (8 g) was added to the resin to dilute it. The resulting solution had a viscosity of 22 Pa s at 25° C.

The product is substantially of formula VIII, where b represents zero, e has an average value of 2.0, each $R^{10}$ denotes a hydrogen atom, each $R^{11}$ denotes a group of formula XI, and each $R^{12}$ denotes a group of formula XXI.

1-Phenyl-1,2-propanedione 2-(O-ethoxycarbonyl)oxime (0.02 g) and benzil dimethyl ketal (0.02 g) were dissolved in 2 g of the solution. A film 4 μm thick of the sensitised solution was drawn on card 0.33 mm thick and exposed to U.V. irradiation by passing once through a "Mini-cure" apparatus (Primarc Ltd., Stoke Row, near Henley-on-Thames, England) containing two medium pressure mercury arc lamps (80 w per cm) and operating at a belt speed of 60 meters per minute. The cured coating was tack-free and very flexible: it passed a standard test for resistance to solvents, resisting 20 rubs with a cotton wool swab soaked in ethyl methyl ketone and also 20 rubs with a cotton wool swab soaked in water.

EXAMPLE 2

A mixture of N,N'-diglycidyl-5,5-dimethylhydantoin (epoxide content 7.88 equiv./kg, 41.9 g), bisphenol A diglycidyl ether (epoxide content 5.2 equiv./kg, 12.0 g), and 1,4-butanediol (12.0 g), containing chromium III trisoctanoate (0.075 g), was stirred at 185° C. for 5 hours, by which time the epoxide content of the mixture was 2.38 equiv./kg. Acrylic acid (10.7 g) and 2,6-di-t-butyl-4-methylphenol (0.14 g) were added and the mixture was stirred as in Example 1 but for 7 hours, by which time its epoxide content had fallen to a negligibly low value. Water (12 g) was added to the resin to dilute it. The solution had a viscosity of 15 Pa s at 25° C.

The product is substantially of formula VIII where b represents zero, each $R^{10}$ denotes a hydrogen atom, some of the groups $R^{11}$ are of formula XI and the remainder are of formula XXIII, and the groups $R^{12}$ are of formula XXI.

A sensitised solution was prepared and a film 4 μm thick was drawn onto card and irradiated as described in Example 1. The irradiated film was tack-free and very flexible, and it passed the organic solvent and water resistance tests as described in Example 1.

EXAMPLE 3

A mixture of N,N'-diglycidyl-5,5-dimethylhydantoin (epoxide content 7.88 equiv./kg, 25 g), bisphenol A diglycidyl ether (epoxide content 5.2 equiv./kg, 25 g), and 1,4-butanediol (8.5 g), containing chromium III trisoctanoate (0.075 g), was stirred at 185° C. for 6½ hours, by which time the epoxide content of the mixture was 2.55 equiv./kg.

Acrylic acid (10.7 g) and 2,6-di-t-butyl-4-methylphenol (0.14 g) were added and the mixture was stirred as in Example 2 for 7 hours, by which time its epoxide content was negligible. Water (11.3 g) was added to the resin to dilute it.

The product is substantially of formula VIII where b represents zero, each $R^{10}$ denotes a hydrogen atom, some of the groups $R^{11}$ are of formula XI and the remainder are of formula XXIII, and the groups $R^{12}$ are of formula XXI.

A sensitised solution was prepared and a film 4 μm thick of the sensitised solution was drawn onto card and irradiated as described in Example 1. The irradiated film was tack-free and very flexible, and it passed the organic solvent and water resistance tests as described in Example 1.

EXAMPLE 4

A mixture of N,N'-diglycidyl-5,5-dimethylhydantoin (epoxide content 7.83 equiv./kg., 250 g), a diglycidyl ether of polyoxypropylene glycol of average mol. wt. 425 (epoxide content 2.81 equiv./kg., 750 g), bisphenol A (150 g), and sodium hydroxide (0.65 g) was stirred at 165° C. for 5 hours, by which time the epoxide content of the mixture was 2.27 equiv./kg. Acrylic acid (184 g), 2,6-di-t-butyl-4-methylphenol (2.6 g), and chromium III trisoctanoate (1.6 g) were added to the resin at 120° C. The mixture was stirred at 110° C. to 120° C. for 11 hours, by which time its epoxide content was negligible. Water (70 g) was added to the resin to form a solution having a viscosity of 6.1 Pa s at 25° C.

The product is substantially of formula VIII, where b represents zero, each $R^{10}$ denotes a hydrogen atom, some of the groups $R^{11}$ are of formula XI and the remainder are of formula XXIII, and the groups $R^{12}$ are of formula XXII.

Benzil dimethyl ketal (0.4 g) was dissolved in 19.6 g of the solution. A film 4 μm thick of the sensitised solution was drawn onto card and irradiated as described in Example 1. The cured coating was tack-free and very flexible; it resisted 10 rubs with a cotton wool swab soaked in ethyl methyl ketone and also 20 rubs with a cotton wool swab soaked in water.

Similar results were achieved using a product made from a resin in which 2-phenylimidazole had been used as advancement catalyst in place of sodium hydroxide.

EXAMPLE 5

A mixture of N,N'-diglycidyl-5,5-dimethylhydantoin (epoxide content 7.83 equiv./kg, 250 g), the diglycidyl ether of polyoxypropylene glycol of averge mol. wt. 425 (epoxide content 8.81 equiv./kg, 500 g); bisphenol A diglycidyl ether (epoxide content 5.31 equiv./kg, 250 g), bisphenol A (202 g), and sodium hydroxide (0.64 g) was stirred at 165° C. for 5½ hours, by which time the epoxide content was 2.44 equiv./kg. Acrylic acid (200 g), 2,6-di-t-butyl-4-methylphenol (2.8 g), and chromium III trisoctanoate (1.8 g) were added to the resin at 110° C., and the mixture was stirred at 105° to 110° C. for 7 hours, by which time its epoxide content was negligible (less than 0.1 equiv./kg). Water (155 g) was added to the resin to dilute it, forming a solution of viscosity 25.3 Pa s at 25° C.

The product is substantially of formula VIII where b represents zero, each $R^{10}$ denotes a hydrogen atom, some groups $R^{11}$ are of formula XI, some groups $R^{11}$ are of formula XXII and the remainder are of formula XXIII, and the groups $R^{12}$ are also of formula XXIII.

A sensitised solution was prepared as in Example 4 and a film 4 μm thick was drawn onto card and exposed to U.V. irradiation as described in Example 1. The cured coating was tack-free and very flexible, passing the organic solvent- and water-resistance tests as described in Example 1.

EXAMPLE 6

5,5-Pentamethylenehydantoin (16.2 g) was added in portions to a stirred mixture of 1,4-butanediol diglycidyl ether (epoxide content 8.6 equiv./kg, 36.5 g) and N-phenylimidazole (0.02 g), keeping the temperature between 120°–130°. After the addition was complete, the mixture was stirred for 1½ hours at 155°, by which time its epoxide content had fallen to 2.47 equiv./kg. Acrylic acid (9.2 g) and 2,6-di-t-butyl-4-methylphenol (0.1 g) were added at 100° C. The mixture was stirred at 100° to 105° for 5 hours, by which time its epoxide content had fallen to a negligibly low value. Water (10.5 g) was added to dilute the resin. The resulting solution had a viscosity of 12.6 Pa s at 25°.

The product is substantially of formula VIII where b denotes zero, e has an average value of 1.7, each $R^{10}$ denotes a hydrogen atom, each $R^{11}$ denotes a group of formula XXI, and each $R^{12}$ denotes a group of formula XVII.

1-Phenyl-1,2-propanedione 2-(O-ethoxycarbonyl) oxime (0.2 g) and benzil dimethyl ketal (0.2 g) were dissolved in 20 g of the above solution. A film 4 μm thick of the sensitized solution was drawn onto card and irradiated as described in Example 1.

The irradiated film was tack-free and very flexible, and it passed the organic solvent- and water-resistance tests as described in Example 1.

EXAMPLE 7

Adipic acid (13.9 g) was added in portions to a stirred mixture of N,N'-diglycidyl-5,5-dimethylhydantoin (epoxide content 7.8 equiv./kg, 40 g) and N-phenylmidazole (0.02 g), the temperature being kept between 120°–130°. After the addition was complete, the mixture was stirred at 140° for 1 hour, by which time its epoxide content has fallen to 2.1 equiv./kg. Acrylic acid (8.1 g) and 2,6-di-t-butyl-4-methylphenol (0.1 g) were added at 100° and the mixture was stirred at 100°–105° for 4½ hours, by which time its epoxide content had fallen to a negligibly low value. Water was added so that the resulting solution contained 20% water and had a viscosity of 4.3 Pa s at 25°.

The product is substantially of formula VIII where b denotes zero, e has an average value of 2.0, each $R^{10}$ denotes a hydrogen atom, $R^{11}$ denotes a group of formula XI, and each $R^{12}$ denotes adipoyl.

A sensitised solution was prepared as in Example 6 and a film 4 μm thick of the sensitised solution was drawn onto card and irradiated as described in Example 1. The irradiated film was tack-free and very flexible, and it passed the organic solvent- and water-resistance tests as described in Example 1.

EXAMPLE 8

A mixture of diglycidyl hexahydrophthalate (epoxide content 6.4 equiv./kg, 41.2 g), and tetramethylammonium chloride (0.1 g) was heated to 100° C. and 5,5-dimethylhydantoin (10.2 g) was added portionwise over 1 hour. The mixture was then stirred at 100° C. for 4 hours, by which time the epoxide content had fallen to 2.45 equiv./kg.

In a separate vessel, succinic anhydride (30 g), 2-hydroxyethyl acrylate (34.2 g), tetramethylammonium chloride (0.2 g), and 2,6-di-t-butyl-4-methylphenol (0.15 g) were stirred and heated at 90° C. for 3 hours. The mixture was then cooled to give 3-(2-acryloyloxyethoxycarbonyl)propionic acid. This product (27.2 g) was mixed with 2,6-di-t-butyl-4-methylphenol (0.1 g) and added over 1 hour to the advanced resin at 100° C. The mixture was then stirred for a further 4½ hours at 100° C., by with time its epoxide content had fallen to a negligibly low level.

The product is substantially of formula VIII where b represents 1, e represents 1, each $R^{10}$ represents hydrogen, $R^{11}$ represents hexahydrophthaloyl, $R^{12}$ represents a group of formula XI, and $R^{13}$ and $R^{14}$ each represent ethylene.

This product (15 g) and water (5 g) were mixed, and benzil dimethyl ketal (0.2 g) and 2-chlorothioxanthone (0.2 g) were added. A film 6 μm thick was drawn onto card and irradiated for 1 to 2 seconds under a 80 w per cm medium pressure mercury lamp at a distance of 25 cm.

The irradiated coating was tack-free and resisted 2 rubs with a cotton wool swab soaked in ethyl methyl ketone and 5 rubs with a cotton wool swab soaked in water.

EXAMPLE 9

A mixture of N,N'-diglycidyl-5,5-dimethylhydantoin (epoxide content 7.88 equiv./kg, 32 g), tetramethylammonium chloride (0.05 g), and xylene (43 g) was heated to 120° C. and 1,3-dimethylurea (11.0 g) added portionwise. The mixture was stirred at 120° C. for 4¾ hours and a further 0.05 g of tetramethylammonium chloride was added, and the mixture was stirred for 2½ hours at 120° C., by which time its epoxide content had fallen to 2.25 equiv./kg.

The product was allowed to cool to 100° C. and a mixture of methacrylic acid (5.36 g) and 2,6-di-t-butyl-4-methylphenol (0.15 g) was added dropwise over 1 hour, then stirred for a further 6 hours at 100° C. The xylene was evaporated under reduced pressure; the product had an epoxide content of 0.82 equiv./kg.

This product (6 g) was mixd with water (2 g), 1-phenyl-1,2-propanedione 2-(O-ethoxycarbonyl) oxime (0.08 g), and benzil dimethyl ketal (0.08 g). A film 6 μm thick of the sensitised solution was drawn onto card 0.33 mm thick and irradiated for 5 seconds under a 80 w per cm medium pressure mercury lamp at a distance of 25 cm.

The irradiated coating was tack-free and resisted 3 rubs with a cotton wool swab soaked in ethyl methyl ketone and 2 rubs with a cotton wool swab soaked in water.

EXAMPLE 10

5,5-Dimethylhydantoin (77.4 g) was added portionwise to a stirred mixture of 1,4-butanediol.diglycidyl ether (epoxide content 8.6 equiv./kg, 200 g) and tetramethylammonium chloride (0.25 g). The mixture was heated to 120° C. and an exothermic reaction commenced which raised the temperature to 230° C. The mixture was then cooled to 100° C.; it had an epoxide content of 2.2 equiv./kg. 2,6-Di-t-butyl-4-methylphenol (0.44 g) was added, and this was followed by the addition, over 1 hour, of methacrylic acid (54.6 g) and 2,6-di-t-butyl-4-methylphenol (0.88 g). The mixture was heated at 100° C. for 3½ hours, by which time its epoxide content had fallen to 0.6 equiv./kg.

This product (10 parts) was mixed with 2 parts of water, 0.1 part of 2-chlorothioxanthone, and 0.1 part of benzil dimethyl ketal and a layer 6 μm thick of the composition was applied on card. The layer was irradiated for 10 seconds at a distance of 25 cm from a 80 w per cm medium pressure mercury lamp; the film was tack-free and resisted 6 rubs with a cotton wool swab soaked in water.

What is claimed is:

1. A photopolymerizable resin of the formula

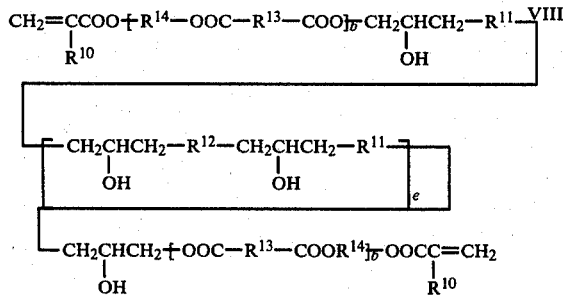

where
b represents zero or 1,
e is an integer of average value at least 1,
each $R^{10}$ denotes a hydrogen atom or a methyl group,
each $R^{11}$ represents the organic divalent residue of a compound having two glycidyl groups directly attached to an atom or atoms of oxygen, nitrogen, or sulfur, after removal of the said two glycidyl groups,
each $R^{12}$ represents the divalent residue of a dihydric alcohol, a dihydric phenol, a saturated dicarboxylic acid of 2 to 8 carbon atoms, or a compound containing two groups selected from amide groups and imide groups, after removal of two terminal hydrogen atoms attached to an oxygen or nitrogen atom or atoms,
each $R^{13}$ denotes an alkylene group of 1 to 6 carbon atoms, an alkenylene group of 2 to 10 carbon atoms, an arylene group of 6 to 10 carbon atoms, or a cycloalkylene or cycloalkenylene group of 5 to 8 carbon atoms,
each $R^{14}$ denotes a divalent aliphatic, cycloaliphatic, or araliphatic group of 2 to 8 carbon atoms,
with the proviso that at least 25% of the total of the (e+1) $R^{11}$ and e $R^{12}$ groups each represent a group of the formula

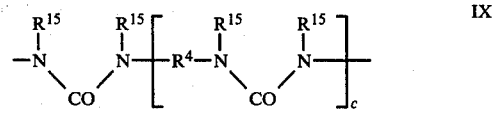

where
$R^4$ represents a divalent aliphatic, cycloaliphatic, or araliphatic radical of 1 to 8 carbon atoms,
c denotes zero or 1, and
each $R^{15}$ denotes an alkyl group of 1 to 4 carbon atoms or each pair of $R^{15}$ conjointly represents a group of formula —CH$_2$CH$_2$—, —C(R$^{16}$R$^{17}$)CO—,

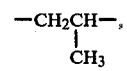

—CH$_2$CH$_2$CH$_2$—, or —COCO—, wherein $R^{16}$ and $R^{17}$ each denote a hydrogen atom or a straight or branched alkyl group of up to 9 carbon atoms or $R^{16}$ and $R^{17}$ may together denote tetramethylene, pentamethylene, methylpentamethylene, or hexamethylene.

2. A resin of claim 1 in which b in formula VIII represents zero.

3. A resin of claim 1 in which e in formula VIII represents an integer of average value of at most 10.

4. A resin of claim 1 in which at most 75% of the total of the (e+1) $R^{11}$ and e $R^{12}$ groups represent a group of formula IX and the remainder of the $R^{11}$ and $R^{12}$ groups each denote an oxyalkyleneoxy group of 2 to 40 carbon atoms, an oxyalkyleneoxy group of 2 to 40 carbon atoms interrupted in the chain by at least one ether oxygen atom, or an oxyaryleneoxy group of to to 18 carbon atoms.

5. A resin of claim 4 in which the alkylene component of the said oyalkyleneoxy group comprises either a chain of 3 to 6 consecutive carbon atoms or a chain of 4 to 28 carbon atoms which is interrupted by at least one ether oxygen atom, and the oxyaryleneoxy group is either a oxyphenyleneoxy group or a group of formula

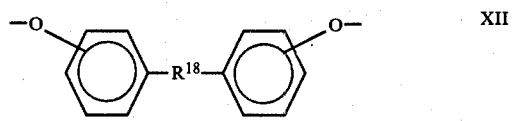

where $R^{18}$ represents a carbon-carbon bond, an ether oxygen atom, a carbonyl group, a sulfonyl group, a methylene group, or an isopropylidene group.

6. A process for the preparation of a resin according to claim 1 in which b in formula VIII represents zero, comprising reaction of the indicated epoxide groups in an advanced diepoxide of formula

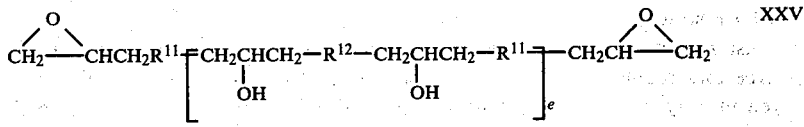

with acrylic acid or methacrylic acid.

7. A process for the preparation of a resin according to claim 1 in which b in formula VIII represents 1, comprising reaction of an advanced diepoxide of formula

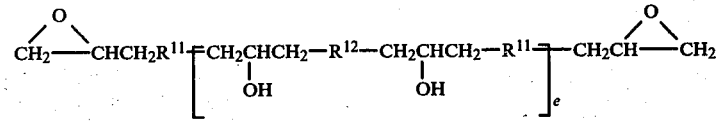

with a dicarboxylic acid of formula $$HOOC-R^{13}-COOH \qquad XXVII$$

or an anhydride of a said dicarboxylic acid, followed by esterification of the thus formed terminal carboxylic acid groups with a hydroxyl group-containing ester having the formula

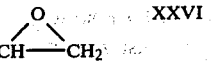

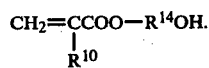

8. A method of polymerising a resin according to claim 1 which comprises subjecting a layer of the resin on a support to actinic radiation.

9. The method of claim 8 in which the resin has been applied to the support in water-borne form.

* * * * *